(12) United States Patent
Lee et al.

(10) Patent No.: US 7,705,690 B2
(45) Date of Patent: Apr. 27, 2010

(54) SERPENTINE GUARD TRACE FOR REDUCING CROSSTALK OF MICRO-STRIP LINE ON PRINTED CIRCUIT BOARD

(75) Inventors: Hyun Bae Lee, Kyungbuk (KR); Hong June Park, Kyungbuk (KR)

(73) Assignee: Postech Foundation (KR)

( * ) Notice: Subject to any disclaimer, the term of this patent is extended or adjusted under 35 U.S.C. 154(b) by 184 days.

(21) Appl. No.: 11/508,038

(22) Filed: Aug. 22, 2006

(65) Prior Publication Data
US 2007/0236303 A1    Oct. 11, 2007

(30) Foreign Application Priority Data
Apr. 7, 2006    (KR) .................... 10-2006-0031987

(51) Int. Cl.
*H01P 3/08*    (2006.01)
(52) U.S. Cl. .......................................... 333/1; 333/246
(58) Field of Classification Search ...................... 333/1, 333/246
See application file for complete search history.

(56) References Cited
U.S. PATENT DOCUMENTS 6,380,818 B1 *   4/2002   Lee ................................ 333/1
6,433,648 B1 *   8/2002   Lee ................................ 333/1

* cited by examiner

*Primary Examiner*—Benny T. Lee
(74) *Attorney, Agent, or Firm*—Yae Y. Park; Kile Geokjian Reed & McMamus

(57) ABSTRACT

A serpentine guard trace for reducing far-end crosstalk of a micro strip transmission line is provided. The serpentine guard trace reduces receiving-end crosstalk caused by an electromagnetic interference of a signal of a nearby transmission line when transmitting a high speed signal through a micro strip transmission line on a printed circuit board. The serpentine guard trace is located between two nearby transmission lines and has a line width narrower than that of transmission lines for an effective serpentine structure. A characteristic impedance of the serpentine guard trace increases due to the narrow line width. Termination resistors having impedance which is the same as the characteristic impedance of the serpentine guard trace are located on both ends of the guard trace to minimize a reflection wave generated in the serpentine guard trace. The receiving-end crosstalk can be effectively reduced by using the serpentine guard trace instead of a linear guard trace. Accordingly, the serpentine guard trace can be effectively used when a high speed signal is transmitted on a printed circuit board.

7 Claims, 5 Drawing Sheets

Length of the section of the serpentine guard trace

SERPENTINE GUARD TRACE FOR REDUCING CROSSTALK OF MICRO-STRIP LINE ON PRINTED CIRCUIT BOARD

BACKGROUND OF THE INVENTION

1. Field of the Invention

The present invention relates to a transmission line, and more particularly, to a channel structure including a serpentine guard trace for reducing receiving-end crosstalk caused by electromagnetic interference of a signal of a nearby transmission line when transmitting a high speed signal through a transmission line on a printed circuit board.

2. Description of the Related Art

Far-end crosstalk refers to an interference between a signal transmitted through one transmission line and a signal transmitted through a nearby transmission line when transmitting the signal using a plurality of pairs of transmission lines. The far-end crosstalk is a phenomenon due to an electromagnetic interference and causes serious signal loss when transmitting a high speed signal.

FIG. 1 is a schematic diagram illustrating the far-end crosstalk occurring in the other transmission line 120 when a signal is applied to one of two nearby transmission lines 110 and 120. The transmission line to which the signal $V_a$ is applied is called an aggressor line 110, and the transmission line to which no signal is applied is called a victim line 120. The far-end crosstalk is caused by inductive coupling due to a mutual inductance Lm and capacitive coupling due to a mutual capacitance Cm shown in an electrical element model of FIG. 2. The far-end crosstalk is divided into crosstalk propagating to a transmitter and crosstalk propagating to a receiver. When the crosstalk reaches both ends, the crosstalk becomes receiving-end crosstalk ($V_{Fe}$) and transmitting-end crosstalk ($V_{ne}$), respectively. In FIG. 1, $V_a$ is a voltage applied to the transmitting end of the aggressor line, and TD is a transmission time for the transmission. In FIG. 2, $C_S$ is a self capacitance per unit length, and $L_S$ is a self inductance per unit length. In FIG. 1, when it is assumed that a termination resistor R0=Z, Mathematical Expression 1 below is derived.

$$Vne(t) = \frac{1}{4}\left(\frac{Cm}{Ct} + \frac{Lm}{Ls}\right)(V_a(t) - V_a(t - 2TD))$$ [Mathematical Expression 1]

$$Vfe(t) = \frac{1}{2}\left(\frac{Cm}{Ct} - \frac{Lm}{Ls}\right)\frac{\delta V_a(t - TD)}{\delta t}$$ [Mathematical Expression 2]

Here, l is a length of the transmission line, TD is a transmission time for the transmission line, $C_m$ is a mutual capacitance per unit length, $C_t$ is a sum of self capacitance and mutual capacitance per unit length, $L_m$ is a mutual inductance per unit length, and $L_S$ is a self inductance per unit length. In addition, $V_a(t)$ is a voltage applied to the transmitting end of the aggressor line, $V_a(t-TD)$ is a voltage applied to the transmitting end of the aggressor line after TD, and $\delta V_a(t-TD)/\delta t$ is a variation of $V_a(t-TD)$ according to time t. In addition, R0 is a termination resistor disposed at both ends of the two signal lines, and Z is a resistance value which is the same as a resistive component of a characteristic impedance of the signal line.

The transmitting-end crosstalk ($V_{ne}$) occurs continuously with a constant level while the signal propagates to the receiving-end as shown by Mathematical Expression 1. Accordingly, the transmitting-end crosstalk can be easily removed by digital calibration and so forth. However, the receiving-end crosstalk ($V_{Fe}$) instantly occurs only when an applied signal is changed, as shown by Mathematical Expression 2. Accordingly, it is difficult to remove the receiving-end crosstalk in a circuit. On the other hand, in case of a transmission line in a homogeneous medium such as a strip line, capacitive coupling strength is equal to inductive coupling strength. Ideally, Mathematical Expression 2 is equal to 0. Accordingly, in a system where the receiving-end crosstalk is a serious problem, the strip line is used as the transmission line to solve the problem. However, the strip line is more expensive in production than the micro-strip line. Therefore, the micro-strip line is used for a general digital system.

In case of the micro-strip line of which one side is exposed to air, the inductive coupling is stronger than the capacitive coupling. The coupling exponentially decays as the distance between the nearby transmission lines becomes larger. Therefore, it is possible to reduce the receiving-end crosstalk by sufficiently separating the nearby transmission lines one from another. To verify this, in a cross sectional view of a printed circuit board of FIG. 3, the receiving-end crosstalk is measured by alternating the distance S of the nearby transmission lines between 14 mil and 42 mil, to obtain the result of FIG. 4. In addition, as shown in FIG. 3, a dielectric material such as FR-4 (Flame Retardant-4) having a dielectric constant $\in$ of 4.5 may be used for the printed circuit board. In FIG. 3 'mil' is a unit of length, 1 mil is equal to $\frac{1}{1000}$ inch, and 'Air' means that one side of the transmission line is exposed to air. '1.4 mil' is a thickness of a printed circuit board, '8 mil' is a thickness of a dielectric material, '0.7 mil' is a thickness of the transmission line, '14 mil's are width of the transmission lines, and 'S' is the distance between the nearby transmission lines. In FIG. 4, the vertical axis represents the strength of crosstalk of the receiving end in units of mv, and the horizontal axis represents the transmission time in units of ps.

Referring to FIG. 4, as the distance between the nearby transmission lines is increased, the receiving-end crosstalk is reduced, and, however, the considerable receiving-end crosstalk remains. In FIG. 4, a solid line represents the far-end crosstalk in case of the distance between the nearby transmission lines is 14 mil, and a dotted line represents the far-end crosstalk in case of the distance between the nearby transmission lines is 42 mil. To reduce the remaining receiving-end crosstalk, as shown in FIG. 5, a guard trace is located between the nearby transmission lines as in the conventional methods. FIG. 6 shows a cross sectional view of a printed circuit board for verifying the reduction of the receiving-end crosstalk of the guard trace structure of FIG. 5. In FIG. 5, characteristic impedance of the guard trace between the nearby transmission lines is generally equal to that of the signal line. Accordingly, a termination resistor of the guard trace has the same resistance with other signal lines. In FIG. 5, TD is a transmission time for the transmission line, Z is a resistance value which is the same as a resistive component of a characteristic impedance, $V_{a1}$ is a voltage applied to the transmitting end of the aggressor line, R0 is a termination resistance of the transmission line, R1 is a termination resistance of the guard trace, and $V_{Fe}$ is a crosstalk of the receiving end of the victim line. In addition, as shown in FIG. 6, a dielectric material such as FR-4 (Flame Retardant-4) having a dielectric constant $\in$ of 4.5 may be used for the printed circuit board. In FIG. 6 'Air' means that one side of the transmission line is exposed to air, '1.4 mil' is a thickness of a printed circuit board, '8 mil' is a thickness of a dielectric material, '0.7 mil' is a thickness of the transmission line. '14 mil's represent the width of the transmission lines, the width of the guard trace, and the distance between transmission line and guard trace.

FIG. 7 shows a measurement result of the receiving-end crosstalk with respect to time axis to verify an effect of the guard trace of FIGS. 5 and 6. In FIG. 7, the vertical axis represents the strength of crosstalk of the receiving end in units of mv, and the horizontal axis represents the transmission time in units of ps. In FIG. 7, a solid line represents the receiving-end crosstalk without guard trace, and a dotted line represents the receiving-end crosstalk with conventional guard trace. As shown in FIG. 7, when the conventional guard trace is used, the receiving-end crosstalk is partially reduced, however, the system performance cannot be remarkably improved.

SUMMARY OF THE INVENTION

The present invention provides a channel structure including a guard trace having a new structure capable of effectively reducing receiving-end crosstalk by improving a conventional guard trace structure.

According to an aspect of the present invention, there is provided a channel including: a first transmission line; a second transmission line separated from the first transmission line; and a serpentine guard trace having a serpentine shape and a line width narrower than those of the first and second transmission lines, which is disposed between the first and second transmission lines.

In the above aspect of the present invention, a length of the serpentine guard trace perpendicular to the signal propagating direction of the first and second transmission lines is increased.

In addition, termination resistors having impedance which is the same as the characteristic impedance of the serpentine guard trace are disposed at both ends of the guard trace.

According to another aspect of the present invention, there is provided a channel including: a first transmission line; a second transmission line separated from the first transmission line; and a serpentine guard trace having a serpentine shape including a length of a first section in parallel with the first and second transmission lines and a length of second section perpendicular to the first and second transmission lines and having a line width narrower than those of the first and second transmission lines, which is disposed between the first and second transmission lines.

In the above aspect of the present invention, the length (L) of the first section has a range of $0.5 \times S \leq L \leq 20 \times S$, and S is a distance between the first and second transmission lines.

In addition, the length of the second section is increased by reducing a width of the serpentine guard trace to be less than widths of the first and second transmission lines.

Accordingly, the channel structure according to the present invention can effectively reduce the receiving-end crosstalk by changing the conventional linear structure of the guard trace for reducing the receiving-end crosstalk with the serpentine structure. In addition, the receiving-end crosstalk is more easily reduced by disposing the serpentine guard trace between the two signal lines separated by a given distance in the high speed system in which the area of the printed circuit board is limited.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
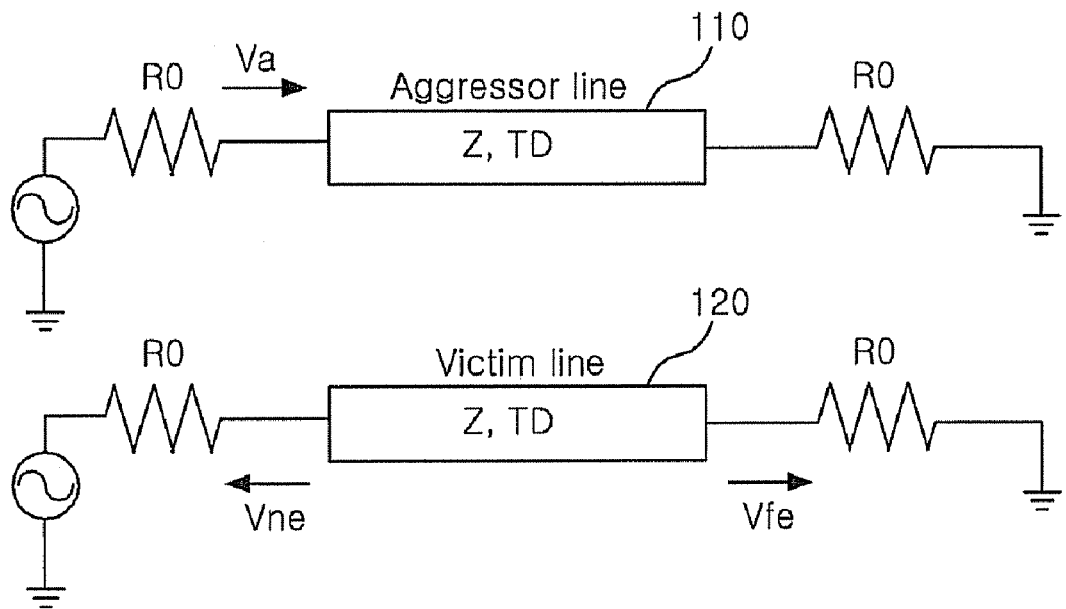
FIGS. 1 and 2 are views for explaining far-end crosstalk occurring between nearby signal lines.
Figure 2:
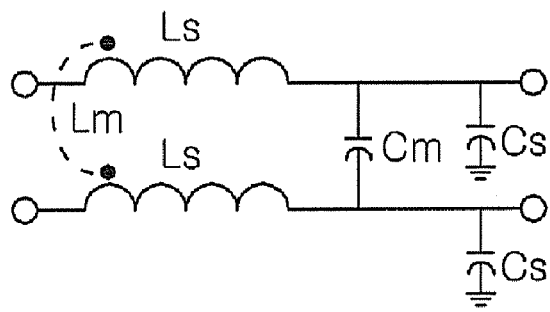
Figure 3:
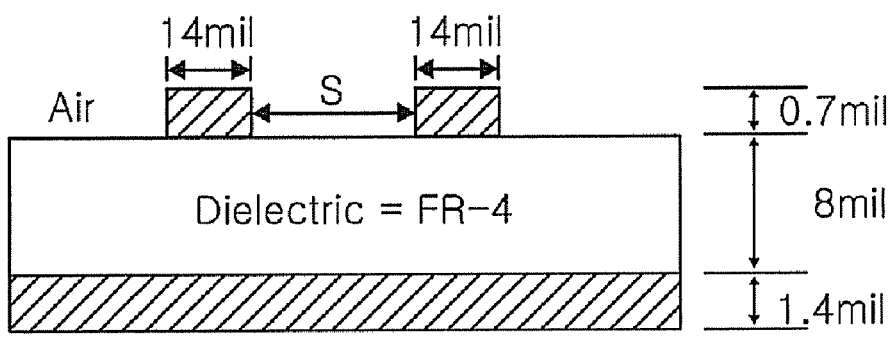
FIG. 3 is a cross sectional view of a printed circuit board for measuring an effect of receiving-end crosstalk according to a distance between nearby transmission lines.
Figure 4:
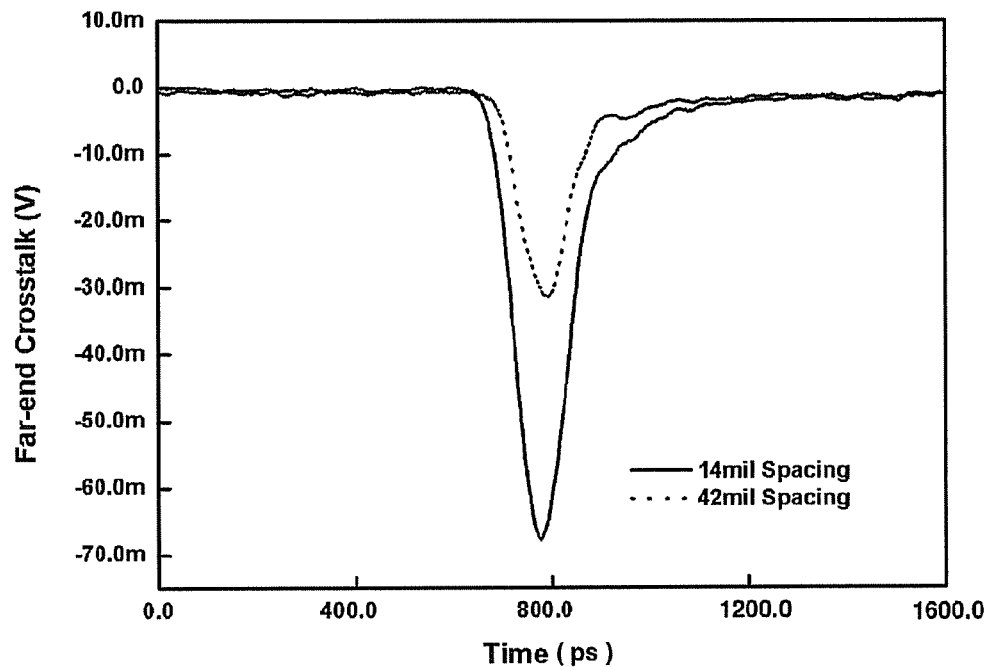
FIG. 4 shows a result of measuring the receiving-end crosstalk according to the distance between the nearby transmission lines with respect to time axis.

The attached drawings for illustrating exemplary embodiments of the present invention are referred to in order to gain a sufficient understanding of the present invention, the merits thereof, and the objectives accomplished by the implementation of the present invention.

Hereinafter, the present invention will be described in detail by explaining exemplary embodiments of the invention with reference to the attached drawings. Like reference numerals in the drawings denote like elements in the different drawing figures and may not be described in detail for all those drawing figures.

Figure 8:
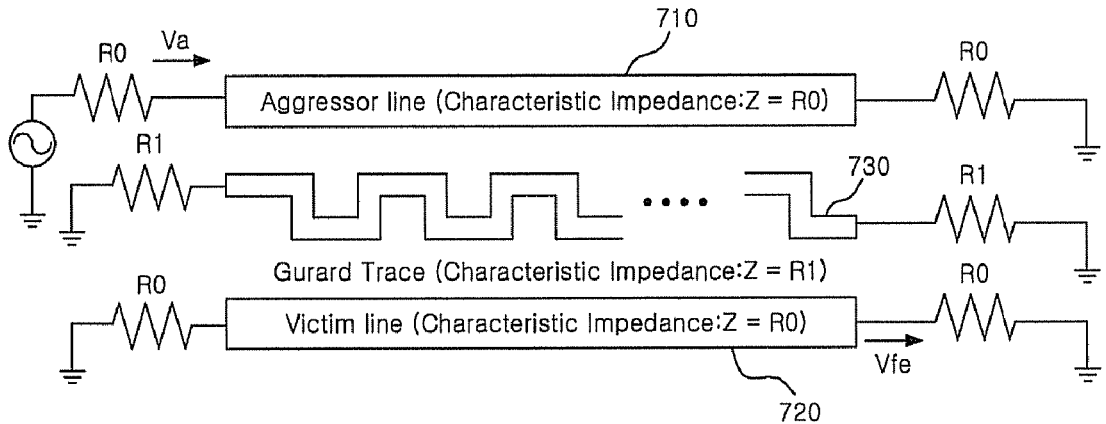
FIG. 8 is a block diagram of a channel including a serpentine guard trace according to the present invention.
Figure 9:
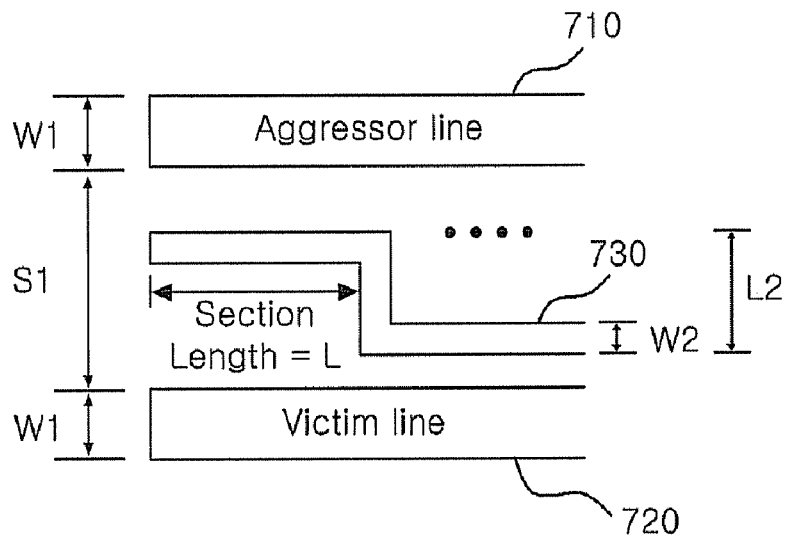
FIG. 9 shows sizes of parts of the serpentine guard trace of FIG. 8.

FIG. 8 is a block diagram of a channel including a serpentine guard trace according to the present invention. Referring to FIG. 8, a serpentine guard trace 730 is disposed between two transmission lines 710 and 720. The serpentine guard trace 730 is longer than the conventional linear guard trace of FIG. 5. In FIG. 8, Aggressor line 710 and Victim line 720 are transmission lines which characteristic impedance Z is R0, and 730 is a guard trace which characteristic impedance Z is R1. Characteristic impedance of a transmission line is the ratio of the amplitude of a single pair of voltage and current waves, and the unit of characteristic impedance is the ohm. To efficiently increase a length of L2, a width of guard trace W2 is reduced to be less than a width of transmission line W1 as shown in FIG. 9. In addition, the characteristic impedance is increased by reducing the width of guard trace W2. Termination resistors having impedance which is the same as the characteristic impedance of the serpentine guard trace are disposed at both ends of the serpentine guard trace to minimize the reflection wave generated in the serpentine guard trace. In FIG. 8, TD is a transmission time for the transmission line, Z is a resistance value which is the same as a resistive component of a characteristic impedance, $V_a$ is a voltage applied to the transmitting end of the aggressor line, R0 is a termination resistance of the transmission line, R1 is a termination resistance of the guard trace, and $V_{Fe}$ is a crosstalk of the receiving end of the victim line. In addition, in FIG. 9, aggressor line is a transmission line which a signal is applied to an end thereof, victim line is a transmission line which a signal is not applied to an end thereof, W1 is a width of the transmission line, S1 is a distance between the transmission lines 710, 720, L is a length of a section, and W2 is a width of the guard trace 730.

Figure 10:
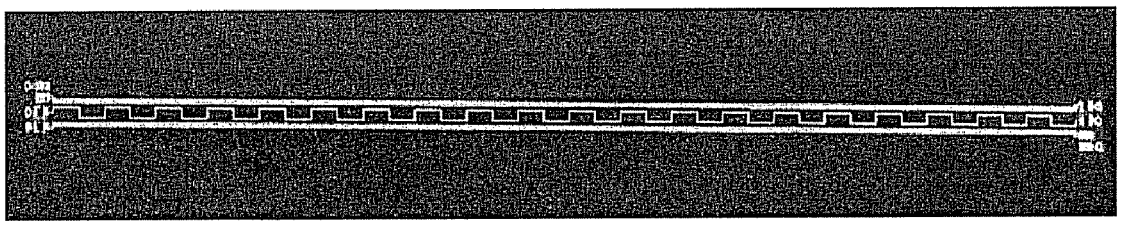
FIG. 10 is a photograph of the printed circuit board for verifying the effect of reducing the receiving-end crosstalk of the serpentine guard trace of FIG. 7.

In the structure of the serpentine guard trace, as shown in FIG. 9, a parameter such as a length of section exists, and it is necessary to optimize the length of section to minimize receiving-end crosstalk. Far-end crosstalk is measured by changing the length of section. FIG. 10 is a photograph of the printed circuit board embodying the serpentine guard trace of FIG. 8.

Figure 5:
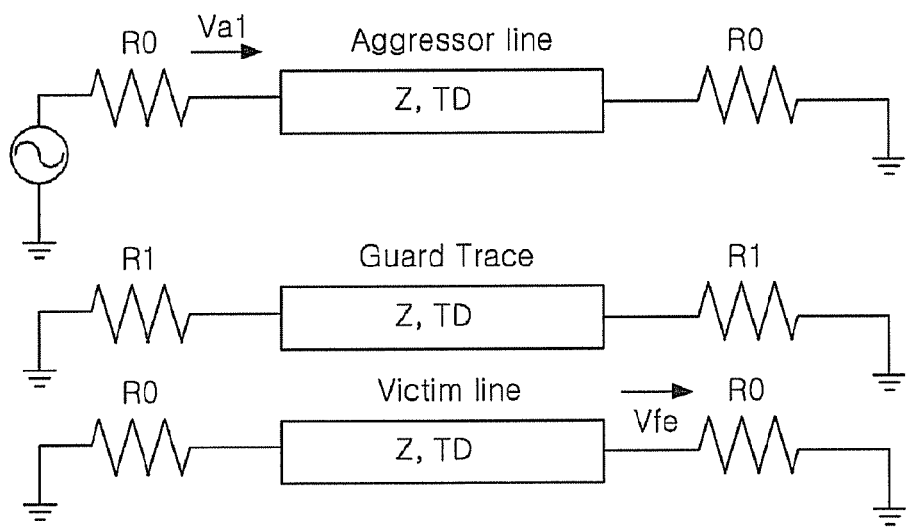
FIG. 5 is a block diagram of a conventional guard trace for reducing far-end crosstalk.
Figure 6:
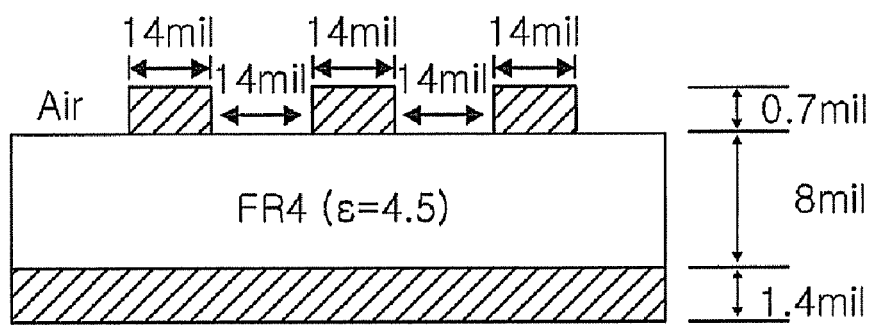
FIG. 6 is a cross sectional view of a printed circuit board of the guard trace of FIG. 4.
Figure 7:
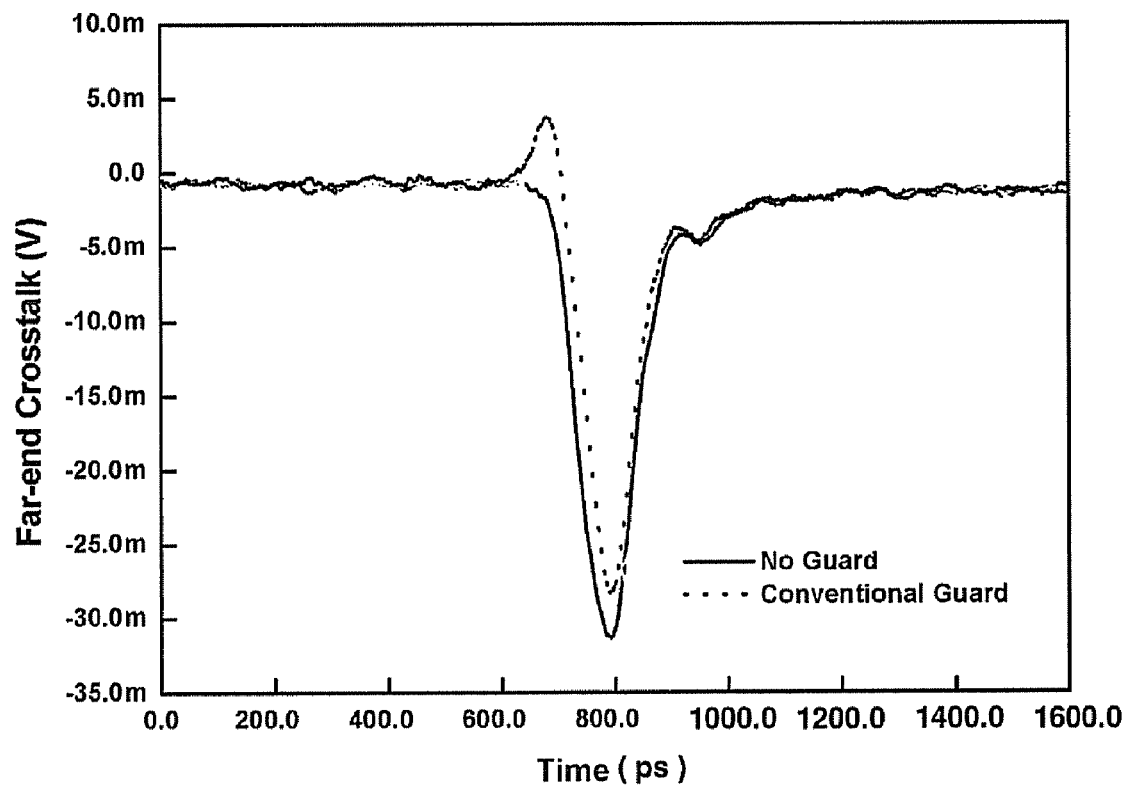
FIG. 7 shows a measurement result of the receiving-end crosstalk with respect to time axis to verify an effect of the guard trace of FIG. 5.
Figure 11:
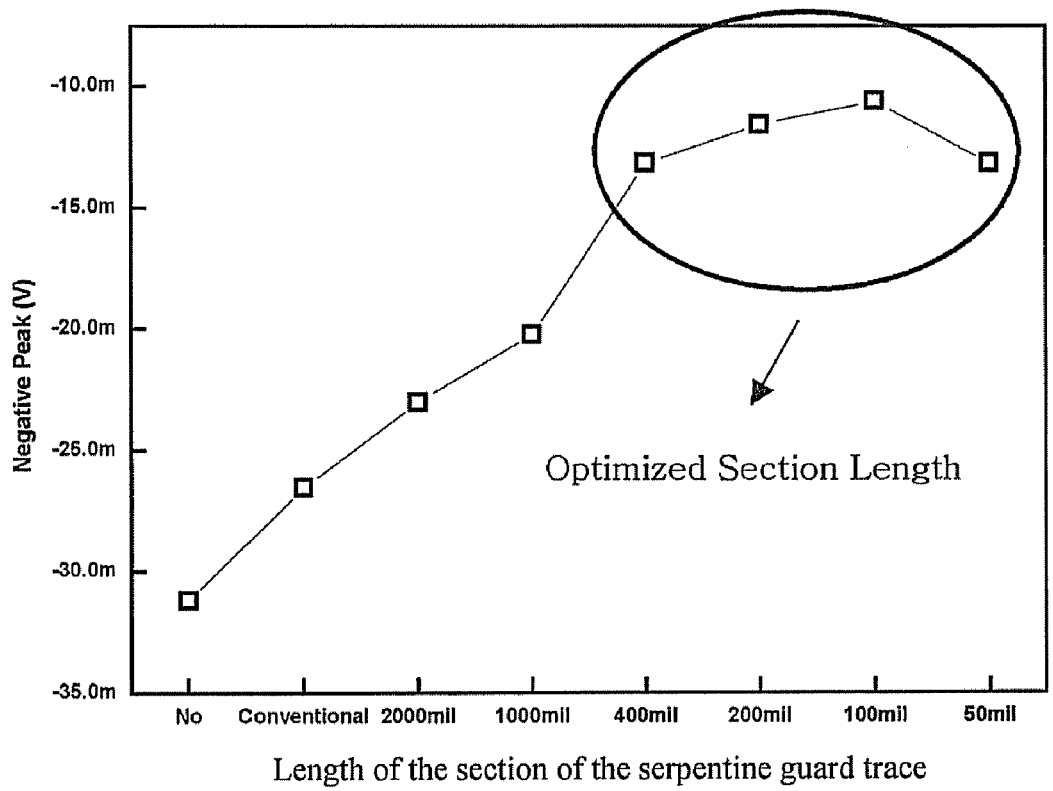
FIG. 11 is a graph showing peak values of the receiving-end crosstalk of the structure with no guard trace and the structure with the conventional guard trace of FIG. 4 and peak values of the receiving-end crosstalk according to the length of section of the serpentine guard trace according to the present invention of FIG. 8.

FIG. 11 is a graph showing peak values of the receiving-end crosstalk of the structure with no guard trace when W1=14 mil and S1=42 mil in FIG. 9 and the structure with the conventional guard trace of FIG. 5 and peak values of the receiving-end crosstalk according to the length of section L of the serpentine guard trace when W2=6 mil, S2=6 mil, and L2=30 mil in FIG. 9 according to the present invention. In FIG. 11, the vertical axis represents the strength of crosstalk of the receiving end in units of mv, and the horizontal axis represents the length of section L. As shown in FIG. 11, the receiving-end crosstalk increases when the length of section is extremely long or extremely short. Accordingly, when it is assumed that a distance between the signal lines is S, an optimized range of the length of section is evaluated by Mathematical Expression 3 below.

$$0.5 \times S \leq (\text{Length of Section}) \leq 20 \times S \quad \text{[Mathematical Expression 3]}$$

Figure 12:
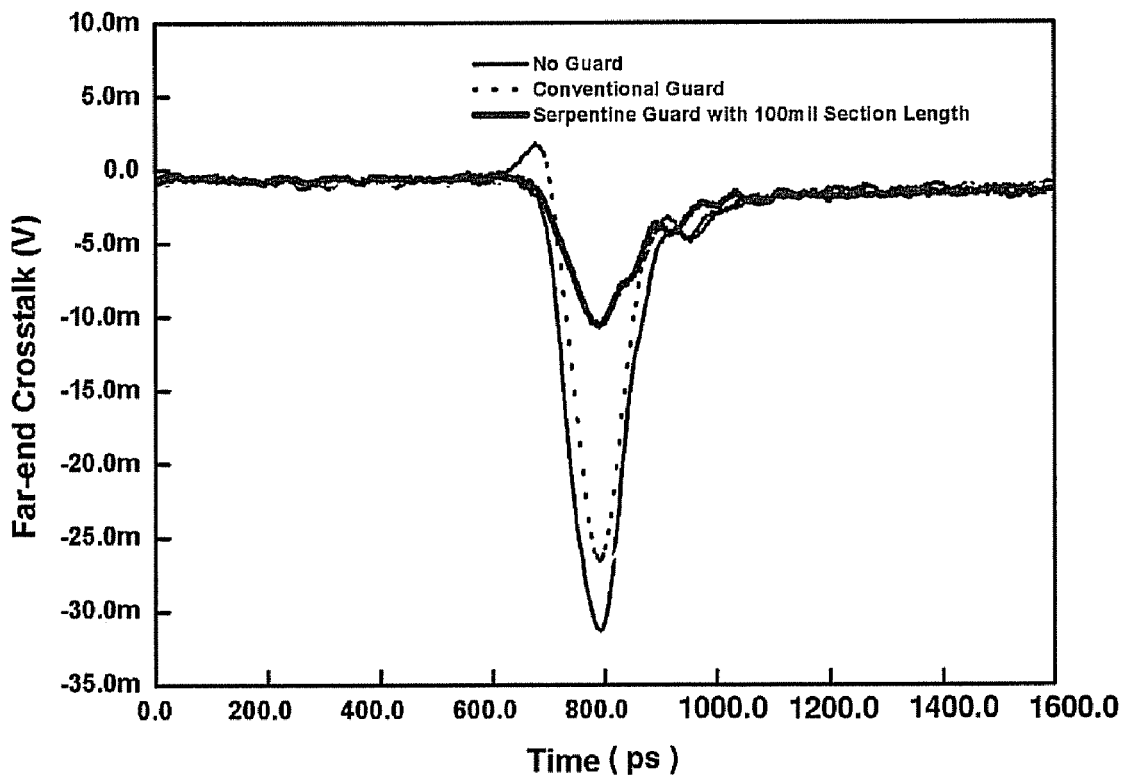
FIG. 12 is a graph showing results of measuring the receiving-end crosstalk of the structure with serpentine guard trace having the length of 100 mils, that is, the optimized length of section according to the present invention, the structure with the conventional guard trace of FIG. 5, and the structure with no guard trace, with respect to time axis.

FIG. 12 is a graph showing results of measuring the receiving-end crosstalk of the structure with serpentine guard trace having the length of 100 mils, that is, the optimized length of section according to the present invention, the structure with the conventional guard trace of FIG. 5, and the structure with no guard trace, with respect to time axis. In FIG. 12, the vertical axis represents the strength of crosstalk of the receiving end in units of mv, and the horizontal axis represents the transmission time in units of ps. In FIG. 12, a solid line represents the receiving-end crosstalk without guard trace, a dotted line represents the receiving-end crosstalk with conventional guard trace, and a thick solid line represents the receiving-end crosstalk with serpentine guard trace with 100 mil section length. The measurement result for the serpentine guard trace with the optimized length of section of 100 mils of FIG. 12 according to the present invention is obtained using the printed circuit board of FIG. 10. As shown in FIG. 12, the structure with the serpentine guard trace can reduce the receiving-end crosstalk by 2.6 times comparing with the conventional guard trace structure of FIG. 5.

While the present invention has been particularly shown and described with reference to exemplary embodiments thereof, it will be understood by those of ordinary skill in the art that various changes in form and details may be made therein without departing from the spirit and scope of the present invention as defined by the following claims.

The above described invention can effectively reduce the receiving-end crosstalk by changing the conventional linear structure of the guard trace for reducing the receiving-end crosstalk with the serpentine structure. Accordingly, the receiving-end crosstalk is more easily reduced by disposing the serpentine guard trace between the two signal lines separated by a given distance in the high speed system in which the area of the printed circuit board is limited.

What is claimed is:

1. A channel comprising:
   a first transmission line;
   a second transmission line separated from the first transmission line; and
   a serpentine guard trace, having a serpentine shape and a line width narrower than a respective width of the first and second transmission lines, which is disposed between the first and second transmission lines.

2. The channel of claim 1, wherein a length of the serpentine guard trace is increased in a direction perpendicular to the signal propagating direction of the first and second transmission lines.

3. The channel of claim 1, wherein termination resistors having impedance which is the same as the characteristic impedance of the serpentine guard trace are disposed at both ends of the guard trace.

4. A channel comprising:
   a first transmission line;
   a second transmission line separated from the first transmission line; and
   a serpentine guard traces having a serpentine shape including a length (L) of a first section in parallel with the first and second transmission lines and a length of a second section perpendicular to the first and second transmission lines and having a line width narrower than the respective width of the first and second transmission lines, which is disposed between the first and second transmission lines.

5. The channel of claim 4, wherein the length (L) of the first section has a range of $0.5 \times S \leq L \leq 20 \times S$, and S is a distance between the first and second transmission lines.

6. The channel of claim 4, wherein the length of the second section is increased by reducing a width of the serpentine guard trace to be less than widths of the first and second transmission lines.

7. The channel of claim 4, wherein termination resistors having impedance which is the same as the characteristic impedance of the serpentine guard trace are disposed at both ends of the serpentine guard trace.

* * * * *